United States Patent
Akram et al.

(10) Patent No.: US 6,853,069 B2
(45) Date of Patent: *Feb. 8, 2005

(54) PACKAGED DIE ON PCB WITH HEAT SINK ENCAPSULANT AND METHODS

(75) Inventors: Salman Akram, Boise, ID (US); James M. Wark, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/639,349

(22) Filed: Aug. 12, 2003

(65) Prior Publication Data

US 2004/0036160 A1 Feb. 26, 2004

Related U.S. Application Data

(63) Continuation of application No. 10/232,782, filed on Aug. 28, 2002, now Pat. No. 6,617,684, which is a continuation of application No. 09/835,541, filed on Apr. 16, 2001, now Pat. No. 6,534,858, which is a continuation of application No. 09/189,102, filed on Nov. 9, 1998, now Pat. No. 6,252,308, which is a continuation of application No. 08/653,030, filed on May 24, 1996, now Pat. No. 5,866,953.

(51) Int. Cl.⁷ .......................... H01L 23/34; H01L 23/38
(52) U.S. Cl. ....................... 257/706; 257/778; 257/712; 257/713; 257/720; 257/722; 438/107; 438/108; 438/715
(58) Field of Search .................. 257/706, 712, 257/778, 720, 722, 713; 438/107, 108, 715

(56) References Cited

U.S. PATENT DOCUMENTS

| | | |
|---|---|---|
| 4,143,456 A | 3/1979 | Inoue |
| 4,264,917 A | 4/1981 | Ugon |
| 4,300,153 A | 11/1981 | Hayakawa et al. |
| 4,323,914 A | 4/1982 | Berndlmaier et al. |
| 4,358,552 A | 11/1982 | Shinohara et al. |

(List continued on next page.)

FOREIGN PATENT DOCUMENTS

| | | |
|---|---|---|
| JP | 52-77684 | 7/1977 |
| JP | 60-94744 | 5/1985 |
| JP | 60-178651 | 9/1985 |
| JP | 4-157758 | 5/1992 |

*Primary Examiner*—Jasmine Clark
(74) *Attorney, Agent, or Firm*—TraskBritt

(57) ABSTRACT

An apparatus and a method for providing a heat sink on an upper surface of a semiconductor chip by placing a heat-dissipating material thereon which forms a portion of a glob top. The apparatus comprises a semiconductor chip attached to and in electrical communication with a substrate. A barrier glob top material is applied to the edges of the semiconductor chip on the surface ("opposing surface") opposite the surface attached to the substrate to form a wall around a periphery of the opposing surface of the semiconductor chip wherein the barrier glob top material also extends to contact and adhere to the substrate. The wall around the periphery of the opposing surface of the semiconductor chip forms a recess. A heat-dissipating glob top material is disposed within the recess to contact the opposing surface of the semiconductor chip.

31 Claims, 6 Drawing Sheets

U.S. PATENT DOCUMENTS

| | | |
|---|---|---|
| 4,507,675 A | 3/1985 | Fujii et al. |
| 4,642,671 A | 2/1987 | Rohsler et al. |
| 4,801,998 A | 1/1989 | Okuaki |
| 4,931,852 A | 6/1990 | Brown et al. |
| 4,961,107 A | 10/1990 | Geist et al. |
| 5,051,275 A | 9/1991 | Wong |
| 5,101,465 A | 3/1992 | Murphy |
| 5,144,747 A | 9/1992 | Eichelberger |
| 5,173,764 A | 12/1992 | Higgins, III |
| 5,194,930 A | 3/1993 | Papathomas et al. |
| 5,311,060 A | 5/1994 | Rostoker et al. |
| 5,379,186 A | 1/1995 | Gold et al. |
| 5,394,303 A | 2/1995 | Yamaji |
| 5,434,105 A | 7/1995 | Liou |
| 5,436,203 A | 7/1995 | Lin |
| 5,450,283 A | 9/1995 | Lin et al. |
| 5,488,254 A | 1/1996 | Nishimura et al. |
| 5,489,538 A | 2/1996 | Rostoker et al. |
| 5,489,801 A | 2/1996 | Blish, II |
| 5,552,635 A | 9/1996 | Kim et al. |
| 5,641,997 A | 6/1997 | Ohta et al. |
| 5,656,857 A | 8/1997 | Kishita |
| 5,659,952 A | 8/1997 | Kovac et al. |
| 5,866,953 A | 2/1999 | Akram et al. |
| 6,252,308 B1 | 6/2001 | Akram et al. |
| 6,534,858 B2 * | 3/2003 | Akram et al. ............... 257/706 |

* cited by examiner

PACKAGED DIE ON PCB WITH HEAT SINK ENCAPSULANT AND METHODS

CROSS-REFERENCE TO RELATED APPLICATIONS

This application is a continuation of application Ser. No. 10/232,782, filed Aug. 28, 2002, now U.S. Pat. No. 6,617,684, issued Sep. 9, 2003, which is a continuation of application Ser. No. 09/835,541, filed Apr. 16, 2001, now U.S. Pat. No. 6,534,858, issued Mar. 18, 2003, which is a continuation of application Ser. No. 09/189,102, filed Nov. 9, 1998, now U.S. Pat. No. 6,252,308, issued Jun. 26, 2001, which is a continuation of application Ser. No. 08/653,030, filed May 24, 1996, now U.S. Pat. No. 5,866,953, issued on Feb. 2, 1999.

BACKGROUND OF THE INVENTION

Field of the Invention: The present invention relates to an apparatus and a method for providing a heat sink on a semiconductor chip. More particularly, the present invention relates to forming a heat sink on an upper surface of a semiconductor chip by placing a heat conductive material thereon which forms a portion of a glob top.

State of the Art: Chip On Board ("COB") techniques are used to attach semiconductor dice to a printed circuit board including flip chip attachment, wire bonding and tape automated bonding ("TAB").

Flip chip attachment consists of attaching a flip chip to a printed circuit board or other substrate. A flip chip is a semiconductor chip that has a pattern or array of terminations spaced around an active surface of the flip chip for face-down mounting of the flip chip to a substrate. Generally the flip chip active surface has one of the following electrical connectors: Ball Grid Array ("BGA"), wherein an array of minute solder balls is disposed on the surface of a flip chip which attaches to the substrate ("the attachment surface"); Slightly Larger than Integrated Circuit Carrier ("SLICC"), which is similar to a BGA but has a smaller solder ball pitch and diameter than a BGA; or a Pin Grid Array ("PGA"), wherein an array of small pins extends substantially perpendicularly from the attachment surface of a flip chip wherein the pins conform to a specific arrangement on a printed circuit board or other substrate for attachment thereto. With the BGA or SLICC, the solder or other conductive ball arrangement on the flip chip must be a mirror image of the connecting bond pads on the printed circuit board such that precise connection is made. The flip chip is bonded to the printed circuit board by reflowing the solder balls. The solder balls may also be replaced with a conductive polymer. With the PGA, the pin arrangement of the flip chip must be a mirror image of the pin recesses on the printed circuit board. After insertion, the flip chip is generally bonded by soldering the pins into place. An underfill encapsulant is generally disposed between the flip chip and the printed circuit board for environmental protection and to enhance the attachment of the flip chip to the printed circuit board. A variation of the pin-in-recess PGA is a J-lead PGA wherein the loops of the J's are soldered to pads on the surface of the circuit board.

Wire bonding and TAB attachment generally begin with attaching a semiconductor chip to the surface of a printed circuit board with an appropriate adhesive such as an epoxy. In wire bonding, a plurality of bond wires is attached one at a time to each bond pad on the semiconductor chip and extends to a corresponding lead or trace end on the printed circuit board. The bond wires are generally attached through one of three industry-standard wire bonding techniques: ultrasonic bonding, using a combination of pressure and ultrasonic vibration bursts to form a metallurgical cold weld; thermocompression bonding, using a combination of pressure and elevated temperature to form a weld; and thermosonic bonding, using a combination of pressure, elevated temperature and ultrasonic vibration bursts. The semiconductor chip may be oriented either face up or face down (with its active surface and bond pads either up or down with respect to the circuit board) for wire bonding, although face up orientation is more common. With TAB, ends of metal leads carried on an insulating tape such as a polyamide are respectively attached to the bond pads on the semiconductor chip and to the lead or trace ends on the printed circuit board. An encapsulant is generally used to cover the bond wires and metal tape leads to prevent contamination.

After assembly as shown in FIG. 1, a glob of encapsulant material 102 (usually epoxy or silicone or a combination thereof) is generally applied to a COB assembly 100 to surround a semiconductor chip or flip chip 104 which is attached to a substrate 106 via a plurality of electrical connections 108 which extends between a plurality of semiconductor chip bond pads 110 and a corresponding plurality of substrate bond pads 112. An underfill encapsulant 114 is dispensed between the semiconductor chip 104 and the substrate 106. As shown in FIG. 2, the glob top materials 202 are often used to hermetically seal bare dice 204 (shown in shadow) on a printed circuit board 206 such as SIMM modules to form a COB assembly 200. The organic resins generally used in the glob top encapsulation are usually selected for low moisture permeability and low thermal coefficient of expansion to avoid exposure of the encapsulated chip to moisture or mechanical stress respectively. However, even though the chemical properties of these glob top materials have desirable properties for encapsulation, the thermal and electrical properties are often not optimal for removing heat efficiently away from the semiconductor dice or for use in high temperature areas.

Every semiconductor chip in a COB assembly generates some heat during operation. Some glob tops and package encapsulation materials serve to draw the heat away from most semiconductor chips. Indeed, one factor in choosing a package encapsulation material is its thermal dissipation properties. If the temperature of the semiconductor chip is not controlled or accommodated, system reliability problems may occur due to excess temperature rise during operation. The device/semiconductor junction temperature (the location of the heat source due to power dissipation) must be maintained below a limiting value such as 85° C. The primary reason to control this temperature is that switching voltage is a sensitive function of device temperature. In addition, various failure mechanisms are thermally activated and failure rates become excessive above the desired temperature limit. Furthermore, it is important to control the variation in device operating temperature across all the devices in the system. This is also due to the temperature sensitivity of switching voltage since too large a variation from device to device would increase the voltage range over which switching occurs, leading to switching errors due to noise and power-supply fluctuations. Moreover, the fluctuations in temperature cause differential thermal expansions which give rise to a fatigue process that can lead to cracks occurring in the COB assembly during burn-in or general operation.

Thus high heat-producing semiconductor dice such as microprocessors may require adjustments in the size of the COB assembly and will often require the addition of metal heat-dissipating fins, blocks or the like on the package. FIG. 3 illustrates a finned COB assembly 300. The finned COB assembly 300 comprises a semiconductor chip or flip chip 302 which is attached to a substrate 304 via a plurality of electrical connections 306 which extends between a plurality of semiconductor chip bond pads 308 and a corresponding plurality of substrate bond pads 310. An underfill encapsulant 312 is dispensed between the semiconductor chip 302 and the substrate 304. A cap 314 having a plurality of heat-dissipating fins 316 is attached to an upper surface 318 of the semiconductor chip 302 with a layer of thermally conductive adhesive 320. The addition of heat-dissipating fins, blocks or the like substantially increases the cost of production for COB assemblies.

Other means for heat dissipation have also been attempted. U.S. Pat. No. 5,434,105 issued Jul. 18, 1995, to Liou relates to the use of heat spreaders attached to a semiconductor device by a glob top to strengthen the heat coupling from an integrated circuit die to the lead frame wherein heat can then pass through the leads of the lead frame to the circuit board. However, the heat is not dissipated away from the circuit. Rather, the heat is conducted into the circuit board, which can still cause heat related problems. U.S. Pat. No. 5,488,254 issued Jan. 30, 1996, to Nishimura et al. and U.S. Pat. No. 5,489,801 issued Feb. 6, 1996, to Blish relate to encasing a heat slug (a piece of heat conducting material) in the encapsulation material. Although each of these patents attempts to address the problems of potential differences in the thermal coefficient of expansion between the heat slug and the encapsulation material, these attempts are never entirely successful and the adhesion interfaces between the heat slug and the encapsulation material may become separated, allowing moisture to reach and destroy the encased chip.

Changes in encapsulation materials have also been attempted to achieve high thermal conductivity, low coefficient of thermal expansion and low moisture permeability. U.S. Pat. No. 4,358,552 issued Nov. 9, 1982, to Shinohara et al. and U.S. Pat. No. 4,931,852 issued Jun. 5, 1990, to Brown et al. are examples of such attempts. However, no attempt has been entirely successful in balancing all of these desired factors or are simply too expensive.

U.S. Pat. No. 5,379,186 issued Jan. 3, 1995, to Gold et al. ("Gold") relates to a heat-producing semiconductor chip attached to a substrate which uses multiple encapsulants to dissipate heat. "Gold" teaches placing a layer of encapsulant material over the semiconductor chip with a layer of thermally conductive material applied over the encapsulant material layer. "Gold" specifically teaches that the encapsulant material layer used for covering the semiconductor is a relatively poor conductor of heat (i.e., an insulative material) which is assumedly chosen for its adherence and protective properties. The thermally conductive material is applied over the encapsulant material to aid in the removal of heat from the semiconductor device through the insulating encapsulant material. However, this invention is inherently inefficient since the heat must be drawn from an insulative material.

Therefore, it would be advantageous to develop a technique and assembly for inexpensively forming a heat-dissipating mechanism on a semiconductor chip in combination with commercially available, widely practiced semiconductor device fabrication techniques.

BRIEF SUMMARY OF THE INVENTION

The present invention relates to an apparatus and a method for providing a heat sink on a semiconductor chip. The apparatus is constructed with a two-step process for forming a dual material glob top. The process comprises providing a semiconductor chip attached to and in electrical communication with a substrate by any known industry technique such as flip chip attachment, TAB attachment, wire bonding and the like. A barrier glob top material is applied to the edges of the semiconductor chip on the surface ("opposing surface") opposite the surface ("attachment surface") attached to the substrate to form a wall around a periphery of the opposing surface of the semiconductor chip and extends to contact and adhere to the substrate. The barrier glob top performs the function of sealing and protecting the semiconductor chip. Thus the barrier glob top material is selected for low moisture permeability, low thermal coefficient of expansion, and good adhesion and sealing properties. Preferred barrier glob top materials include epoxy, polyamide, urethane silicone, acrylic or the like.

If the semiconductor chip makes electrical contact between the opposing side and the substrate with bond wires or TAB, the wall formed around the periphery of the opposing surface preferably covers and encapsulates the bond wires or TAB. If the semiconductor chip is a flip chip, an underfill encapsulant may be disposed between the semiconductor chip and the substrate.

The wall around the periphery of the opposing surface of the semiconductor chip forms a recess. A heat-dissipating glob top material is disposed within the recess to contact the opposing surface of the semiconductor chip. The heat-dissipating glob top material is chosen for its ability to transfer heat away from the semiconductor chip (i.e., high thermal conductivity material). As a general matter, the heat-dissipating glob top material has a higher thermal conductivity than the barrier glob top material. The heat-dissipating glob top may also extend over the barrier glob top wall to contact the substrate. It is also understood that a plurality of semiconductor chips with barrier glob tops could be attached to a substrate with a continuous heat-dissipating glob top filling each semiconductor chip barrier glob top recess and covering each of the plurality of semiconductor chips. Preferred heat-dissipating glob top materials include: standard, high purity barrier glob top materials containing arsenic, boron, gallium, germanium, phosphorus, silicon or other such suitable highly conductive materials.

Differences in the thermal coefficient of expansion between the barrier glob top and the heat-dissipating glob top and the potential of separation of the interface between the barrier glob top and the heat-dissipating glob top are less an issue with the present invention since the barrier glob top completely seals the semiconductor chip from moisture or external contamination.

Thus, the apparatus of the present invention has all of the adherence and sealing benefits of a low thermal conductivity glob top material while at the same time enjoying the benefits of heat-dissipation provided by a high thermal conductivity glob top material.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
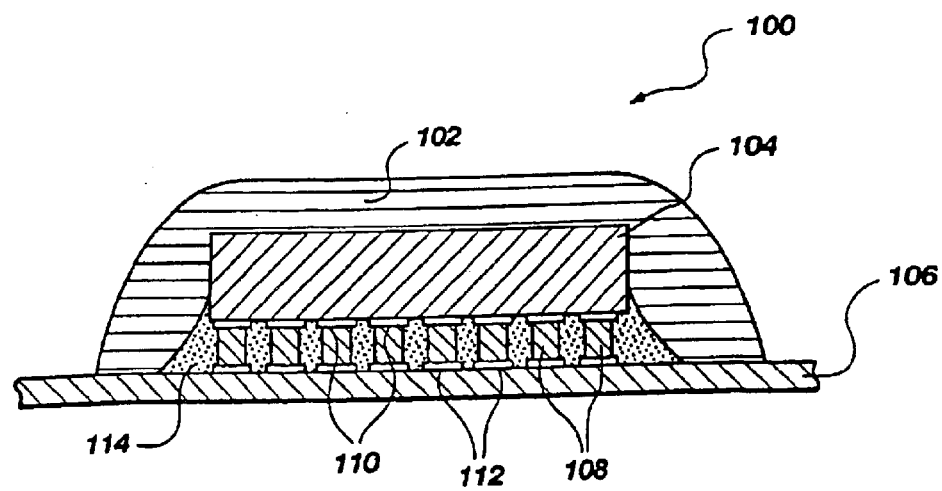
FIG. 1 is a side cross-sectional view of a prior art glob top encapsulated semiconductor chip attached to a substrate.
Figure 2:
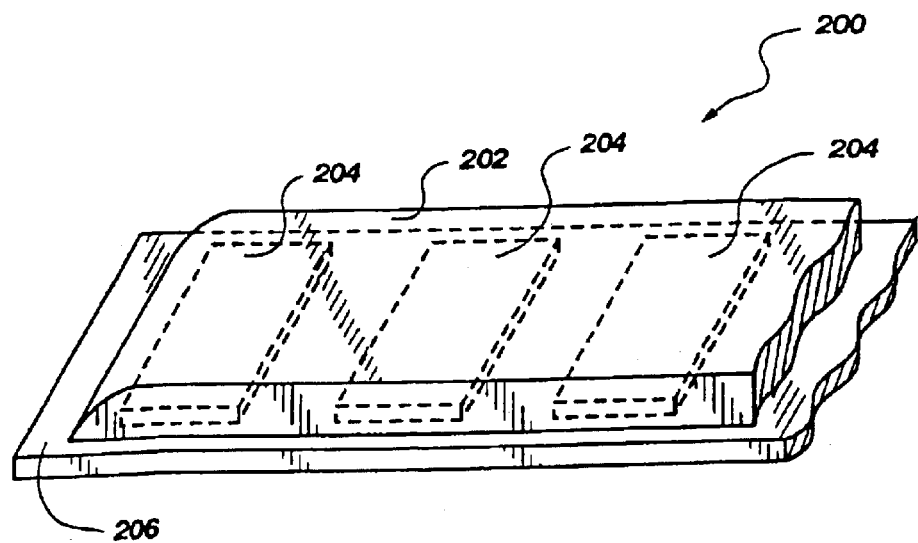
FIG. 2 is an oblique plan view of a prior art substrate with a plurality of semiconductors attached to a substrate with a glob top encapsulation.
Figure 3:
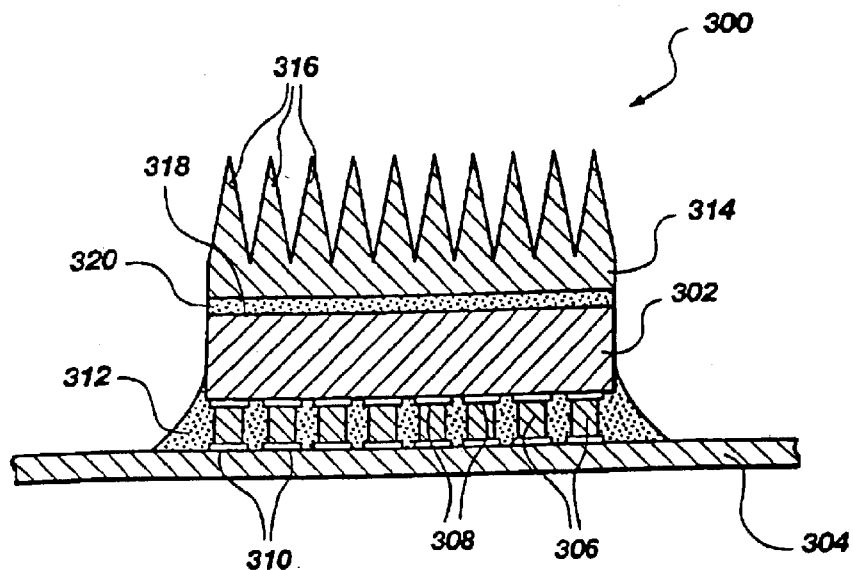
FIG. 3 is a side cross-sectional view of a prior art semiconductor assembly with heat-dissipating fins attached to a substrate.
Figure 4:
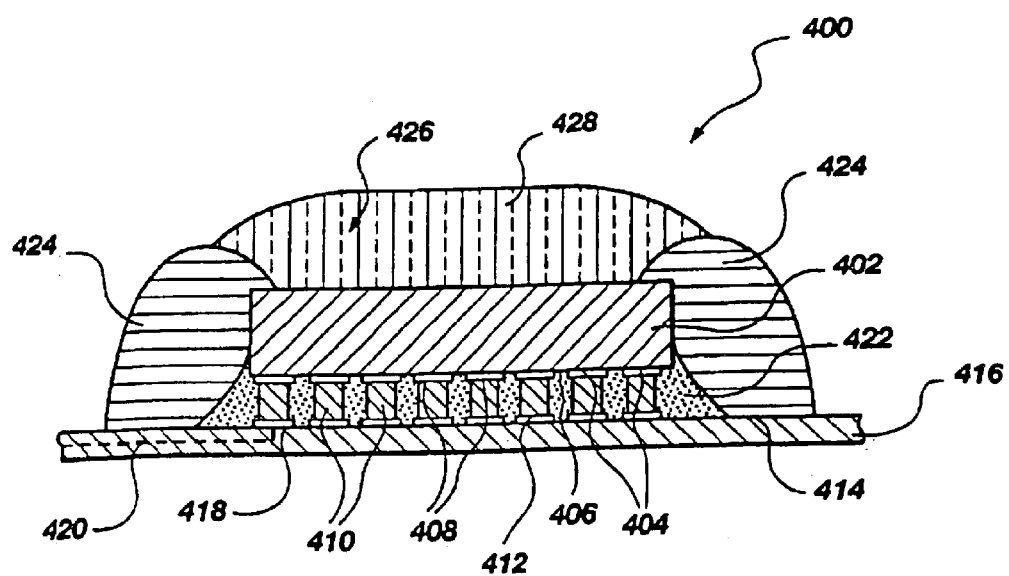
FIG. 4 is a side cross-sectional view of a first encapsulated semiconductor assembly of the present invention.

FIG. 4 illustrates a first encapsulated semiconductor assembly 400 of the present invention. The first encapsulated semiconductor assembly 400 comprises a flip chip or semiconductor chip 402 having a plurality of bond pads 404 on an active surface 406 of the semiconductor chip 402. A facing surface 408 of each bond pad 404 has a conductive pad 410 in electrical communication therewith. The conductive pads 410 are in electrical communication with a plurality of respective bond pads 412 on an upper surface 414 of a substrate 416. Each substrate bond pad 412 is connected on a lower bond pad surface 418 to a trace lead 420 (shown by a dashed line). An underfill encapsulant 422 may be disposed between the semiconductor chip 402 and the substrate 416.

Figure 5:
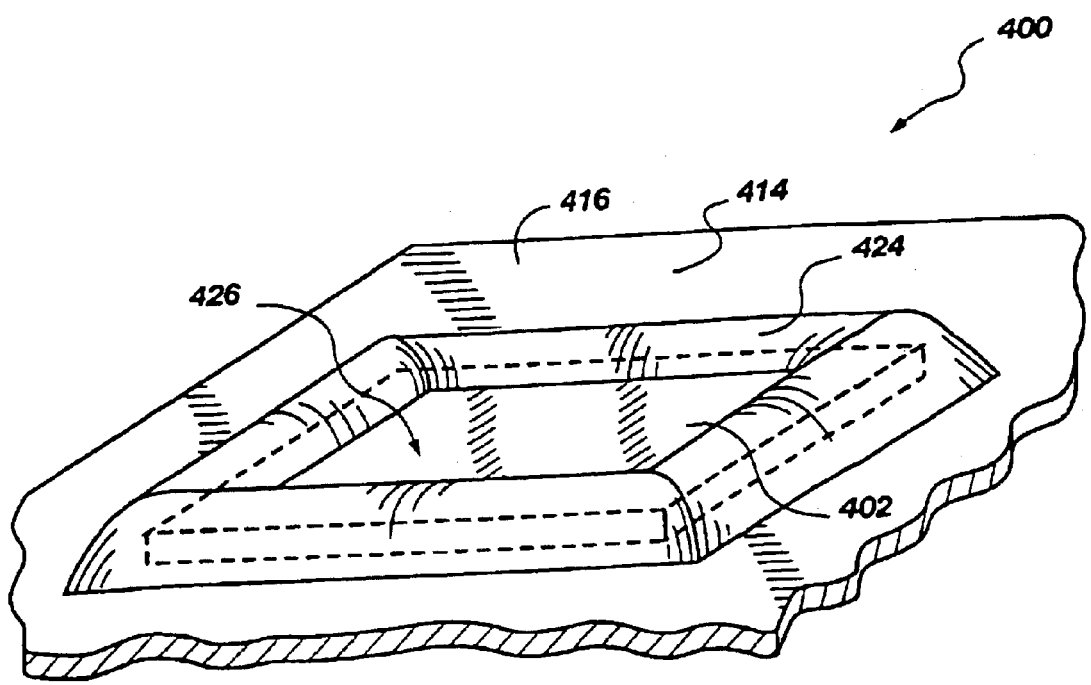
FIG. 5 is an oblique plan view of the first encapsulated semiconductor assembly of FIG. 4.

As seen in FIGS. 4 and 5, a barrier glob top 424 is applied to surround a periphery of the semiconductor chip 402 which seals and protects the semiconductor chip 402 and forms a recess or cavity 426. A heat-dissipating glob top 428 is disposed within the recess 426 as shown in FIG. 4.

Figure 6:
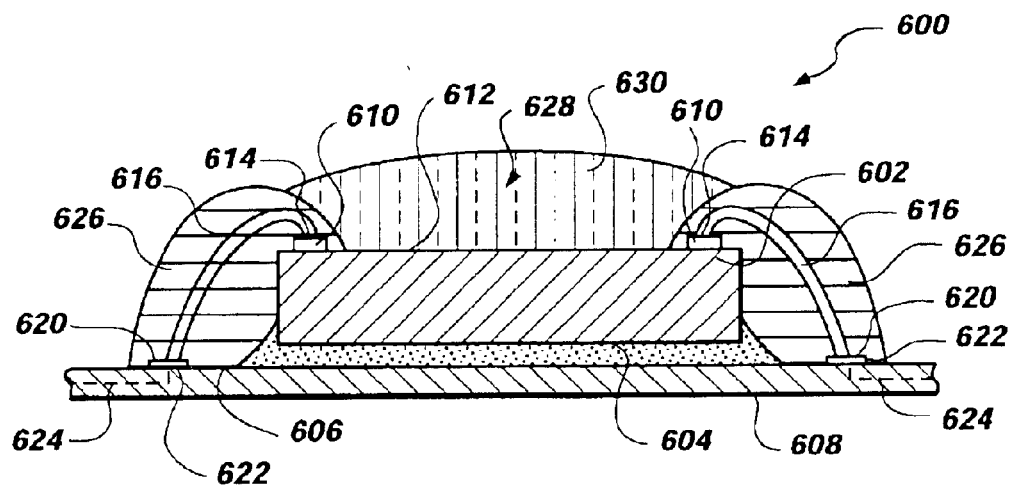
FIG. 6 is a side cross-sectional view of a second encapsulated semiconductor assembly of the present invention.

FIG. 6 illustrates a second encapsulated semiconductor assembly 600 of the present invention. The encapsulated semiconductor assembly 600 comprises a semiconductor chip 602 attached by a back side 604 to a facing surface 606 of a substrate 608. The semiconductor chip 602 has a plurality of bond pads 610 on an active surface 612 of the semiconductor chip 602. A facing surface 614 of each bond pad 610 has a bond wire 616 in electrical communication therewith. Each bond wire 616 is in electrical communication with a respective bond pad 620 on the substrate facing surface 606. Each substrate bond pad 620 is connected on a lower bond pad surface 622 to a trace lead 624 (shown by a dashed line). A barrier glob top 626 is applied to surround a periphery of the semiconductor chip 602, forming a recess or cavity 628. A heat-dissipating glob top 630 is disposed within the recess 628.

Figure 7:
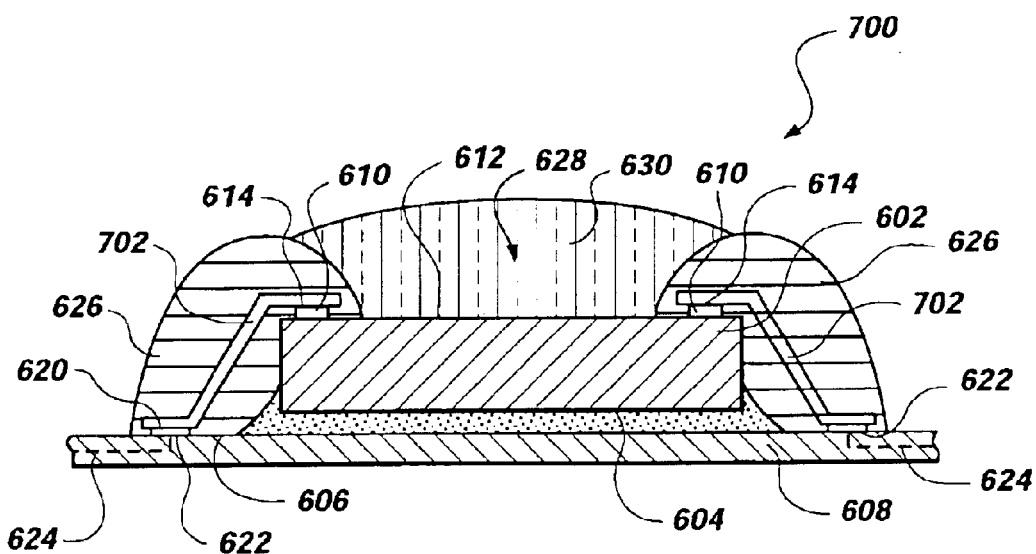
FIG. 7 is a side cross-sectional view of a third encapsulated semiconductor assembly of the present invention.

FIG. 7 illustrates a third encapsulated semiconductor assembly 700 of the present invention. The third encapsulated semiconductor assembly 700 is similar to the second encapsulated semiconductor assembly 600; therefore, components common to FIGS. 6 and 7 retain the same numeric designation. The difference between the third encapsulated semiconductor assembly 700 and the second encapsulated semiconductor assembly 600 is that the third encapsulated semiconductor assembly 700 has a plurality of TAB attachments 702 forming an electrical communication between the facing surface 614 of the semiconductor chip bond pad 610 and the substrate bond pads 620 rather than the bond wires 616 of the second encapsulated semiconductor assembly 600.

Figure 8:
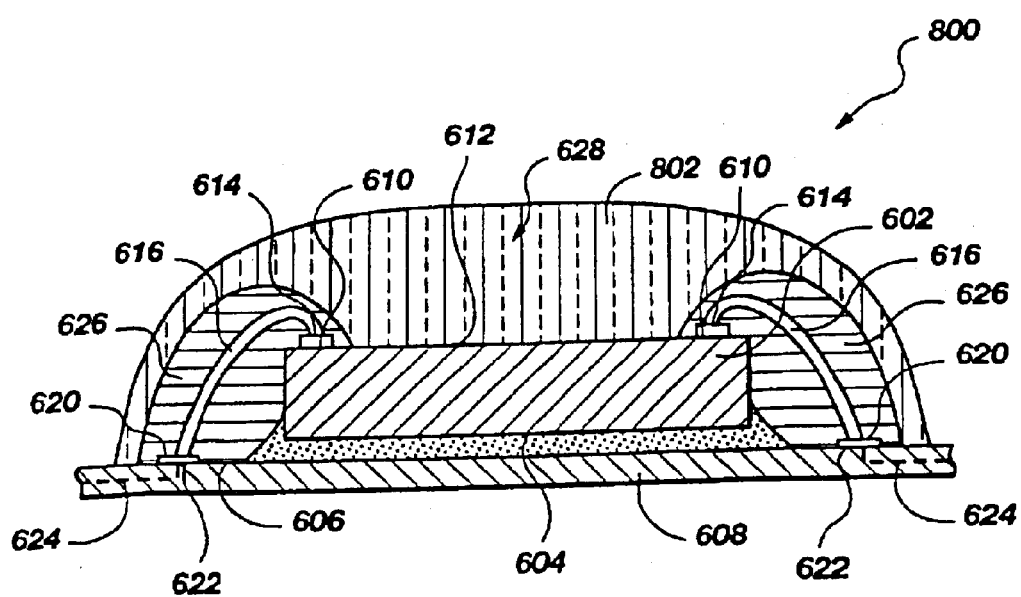
FIG. 8 is a side cross-sectional view of a fourth encapsulated semiconductor assembly of the present invention.

FIG. 8 illustrates a fourth encapsulated semiconductor assembly 800 of the present invention. The fourth encapsulated semiconductor assembly 800 is similar to the second encapsulated semiconductor assembly 600; therefore, components common to FIGS. 6 and 8 retain the same numeric designation. The difference between the fourth encapsulated semiconductor assembly 800 and the second encapsulated semiconductor assembly 600 is that the fourth encapsulated semiconductor assembly 800 has a heat-dissipating glob top 802 which is disposed within the recess 628 and extends over the barrier glob top 626 to contact and adhere to the substrate 608.

Figure 9:
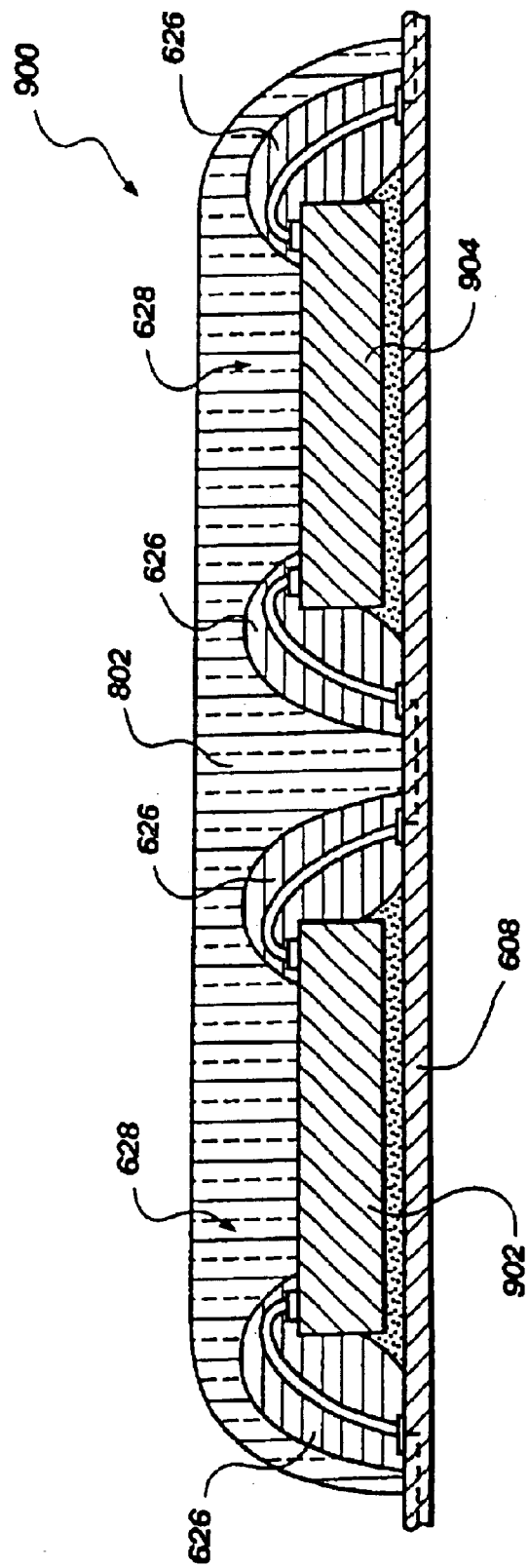
FIG. 9 is a side cross-sectional view of a multiple encapsulated semiconductor dice assembly of the present invention.

FIG. 9 illustrates a multiple encapsulated semiconductor dice assembly 900 of the present invention. The multiple encapsulated semiconductor dice assembly 900 is similar to the fourth encapsulated semiconductor assembly 800; therefore, components common to FIGS. 8 and 9 retain the same numeric designation. The difference between the multiple encapsulated semiconductor dice assembly 900 and the fourth encapsulated semiconductor assembly 800 is that the multiple encapsulated semiconductor dice assembly 900 has multiple semiconductor dice 902 and 904 with a heat-dissipating glob top 802 which extends over the semiconductor dice 902 and 904 to contact and adhere to the substrate 608.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A semiconductor assembly comprising:
    a substrate;
    a semiconductor chip having a first surface and a second surface, at least a portion of the first surface attached to a portion of the substrate and electrically connected to a portion of the substrate;
    a barrier material adhered to a periphery of the second surface of the semiconductor chip substantially forming a wall, the barrier material substantially contacting a portion of the substrate, the barrier material having a first thermal conductivity;
    a recess defined by the wall about the periphery of the second surface of the semiconductor chip; and
    a heat-dissipating material disposed within the recess, the heat-dissipating material having a second thermal conductivity different than the first thermal conductivity of the barrier material.

2. The semiconductor assembly of claim 1, wherein the second thermal conductivity of the heat-dissipating material is greater than the first thermal conductivity of the barrier material.

3. The semiconductor assembly of claim 1, wherein the electrical connection between the semiconductor chip and the substrate comprises at least one bond wire between at least one electrical contact point on the second surface of the semiconductor chip and a respective electrical contact point on the substrate.

4. The semiconductor assembly of claim 3, wherein the barrier material substantially encapsulates the at least one bond wire.

5. The semiconductor assembly of claim 1, wherein the electrical connection between the semiconductor chip and the substrate comprises at least one tape automated bond between at least one electrical contact point on the second surface of the semiconductor chip and a respective electrical contact point on the substrate.

6. The semiconductor assembly of claim 5, wherein the barrier material substantially encapsulates the at least one tape automated bond.

7. The semiconductor assembly of claim 1, wherein the electrical connection between the semiconductor chip and the substrate comprises at least one conductive bond between at least one electrical contact point on the second surface of the semiconductor chip and a respective electrical contact point on the substrate.

8. The semiconductor assembly of claim 7, further comprising an underfill encapsulant disposed between the semiconductor chip and the substrate.

9. An assembly method for a semiconductor assembly comprising:
providing a substrate;
providing a semiconductor chip having a first surface and a second surface;
attaching at least a portion of the first surface of the semiconductor chip to at least a portion of the substrate;
forming an electrical connection between the semiconductor chip and the substrate;
forming a wall substantially around a periphery of the second surface of the semiconductor chip using a barrier material, the wall around the periphery of the second surface of the semiconductor chip defining a recess, the barrier material having a first thermal conductivity;
extending the barrier material to contact the substrate; and
disposing a heat-dissipating material substantially within the recess, the heat-dissipating material having a second thermal conductivity different than the first thermal conductivity of the barrier material.

10. The method of claim 9, wherein the second thermal conductivity of the heat-dissipating material is greater than the first thermal conductivity of the barrier material.

11. The method of claim 9, wherein the electrical connection between the semiconductor chip and the substrate comprises attaching at least one bond wire between at least one electrical contact point on the second surface of the semiconductor chip and a respective electrical contact point on the substrate.

12. The method of claim 11, wherein the barrier material substantially encapsulates the at least one bond wire.

13. The method of claim 9, wherein the electrical connection between the semiconductor chip and the substrate comprises attaching at least one tape automated bond between at least one electrical contact point on the second surface of the semiconductor chip and a respective electrical contact point on the substrate.

14. The method of claim 13, wherein the barrier material substantially encapsulates the at least one tape automated bond.

15. The method of claim 9, wherein the electrical connection between the semiconductor chip and the substrate comprises attaching at least one conductive bond between at least one electrical contact point on the second surface of the semiconductor chip and a respective electrical contact point on the substrate.

16. The method of claim 15, further comprising disposing an underfill encapsulant substantially between the semiconductor chip and the substrate.

17. A semiconductor assembly comprising:
a semiconductor chip having a first surface and a second surface, the first surface attached to at least a portion of a substrate and electrically connected to a portion of the substrate;
a barrier material adhered to a periphery of the second surface of the semiconductor chip substantially forming a wall, a portion of the wall extending beyond the semiconductor chip forming a recess located above the second surface of the semiconductor chip, the barrier material substantially extending to and contacting portions of the substrate, the barrier material having a first thermal conductivity; and
a heat-dissipating material disposed within the recess, the heat-dissipating material having a second thermal conductivity different than the first thermal conductivity of the barrier material.

18. The semiconductor assembly of claim 17, wherein the second thermal conductivity of the heat-dissipating material is greater than the first thermal conductivity of the barrier material.

19. The semiconductor assembly of claim 17, wherein the electrical connection between the semiconductor chip and the substrate comprises at least one bond wire between at least one electrical contact point on the second surface of the semiconductor chip and a respective electrical contact point on the substrate.

20. The semiconductor assembly of claim 19, wherein the barrier material substantially encapsulates the at least one bond wire.

21. The semiconductor assembly of claim 17, wherein the electrical connection between the semiconductor chip and the substrate comprises at least one tape automated bond between at least one electrical contact point on the second surface of the semiconductor chip and a respective electrical contact point on the substrate.

22. The semiconductor assembly of claim 21, wherein the barrier material substantially encapsulates the at least one tape automated bond.

23. The semiconductor assembly of claim 17, wherein the electrical connection between the semiconductor chip and the substrate comprises at least one conductive bond between at least one electrical contact point on the second surface of the semiconductor chip and a respective electrical contact point on the substrate.

24. The semiconductor assembly of claim 23, further comprising an underfill encapsulant substantially disposed between the semiconductor chip and the substrate.

25. A method of making a semiconductor assembly comprising:
providing a substrate;
providing a plurality of semiconductor chips, each semiconductor chip of the plurality having a first surface and a second surface;
attaching a portion of the first surface of each semiconductor chip to a portion of the substrate;
disposing an underfill material substantially between the substrate and each semiconductor chip;
forming an electrical connection between each semiconductor chip and the substrate;
forming a wall substantially around a periphery of the second surface of each semiconductor chip using a barrier material, the wall and the second surface of each semiconductor chip defining a recess, the barrier material having a first thermal conductivity;

extending the barrier material to contact and adhere to the substrate; and disposing a heat-dissipating material substantially within the recess, the heat-dissipating material having a second thermal conductivity different than the first thermal conductivity of the barrier material.

26. The method of claim 25, wherein the second thermal conductivity of the heat-dissipating material is greater than the first thermal conductivity of the barrier material.

27. The method of claim 25, wherein the electrical connection between each semiconductor chip and the substrate comprises attaching at least one bond wire between at least one electrical contact point on the second surface of each semiconductor chip and a respective electrical contact point on the substrate.

28. The method of claim 27, wherein the barrier material substantially encapsulates the at least one bond wire.

29. The method of claim 25, wherein the electrical connection between each semiconductor chip and the substrate comprises attaching at least one tape automated bond between at least one electrical contact point on the second surface of each semiconductor chip and a respective electrical contact point on the substrate.

30. The method of claim 29, wherein the barrier material substantially encapsulates the at least one tape automated bond.

31. The method of claim 25, wherein the electrical connection between each semiconductor chip and the substrate comprises attaching at least one conductive bond between at least one electrical contact point on the second surface of each semiconductor chip and a respective electrical contact point on the substrate.

* * * * *

UNITED STATES PATENT AND TRADEMARK OFFICE
CERTIFICATE OF CORRECTION

PATENT NO.        : 6,853,069 B2                                          Page 1 of 1
APPLICATION NO.   : 10/639349
DATED             : February 8, 2005
INVENTOR(S)       : Salman Akram and James M. Wark It is certified that error appears in the above-identified patent and that said Letters Patent is hereby corrected as shown below:

Delete Figure 8, and Replace FIG. 8 with the following replacement figure:

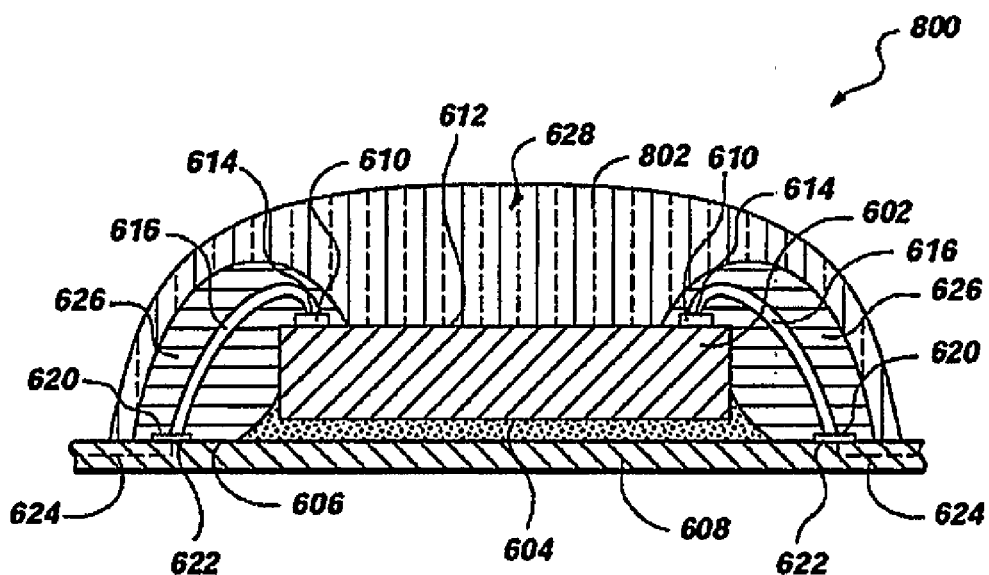

Fig. 8

Signed and Sealed this

Twenty-fourth Day of April, 2007

JON W. DUDAS
*Director of the United States Patent and Trademark Office*